United States Patent [19]

Ishii et al.

[11] Patent Number: 4,837,454

[45] Date of Patent: Jun. 6, 1989

[54] VEHICLE CONTROL APPARATUS

[75] Inventors: Mitsuaki Ishii; Masaaki Miyazaki, both of Hyogo, Japan

[73] Assignee: Mitsubishi Denki Kabushiki Kaisha, Tokyo, Japan

[21] Appl. No.: 125,282

[22] Filed: Nov. 25, 1987

[30] Foreign Application Priority Data

Nov. 25, 1986 [JP] Japan ................................ 61-281202

[51] Int. Cl.⁴ ........................................... G01M 15/00
[52] U.S. Cl. ..................................... 307/10.1; 307/9.1; 364/431.11; 340/52 F; 123/417; 123/479
[58] Field of Search .............. 307/9, 10 R; 340/52 R, 340/52 D, 52 F, 825.05; 364/431.04, 431.06, 431.08, 431.11, 431.12, 723, 510; 324/378, 379, 383, 384, 397; 123/417, 425, 436, 479; 73/35, 650, 117.2, 117.3; 370/58

[56] References Cited

U.S. PATENT DOCUMENTS

| | | | |
|---|---|---|---|
| 4,032,757 | 6/1977 | Eccles | 364/431.11 X |
| 4,128,005 | 12/1978 | Arnston et al. | 364/431.11 X |
| 4,215,404 | 7/1980 | Bukhtiyarov et al. | 364/431.04 |
| 4,286,683 | 9/1981 | Zeigner et al. | 307/10 R X |
| 4,534,214 | 8/1985 | Takahashii | 340/52 F X |
| 4,546,646 | 10/1985 | Takahashii | 340/52 F X |
| 4,593,357 | 6/1987 | Ostrand et al. | 340/52 F X |
| 4,704,685 | 11/1987 | Martinsons et al. | 364/431.11 |

OTHER PUBLICATIONS

"Technique of Motor Vehicle", vol. 38, No. 2, 1984, p. 158.

*Primary Examiner*—William M. Shoop, Jr.
*Assistant Examiner*—Paul Ip
*Attorney, Agent, or Firm*—Sughrue, Mion, Zinn, MacPeak & Seas

[57] ABSTRACT

A vehicle control apparatus comprises a condition detection means for detecting an output condition of any of sensors is in a condition which is improbable in practical use and which is a predetermined one, and a controlled variable conversion means for converting information of the specification change-over means for selection control procedures or control data into a controlled variable for an object to be controlled.

1 Claim, 4 Drawing Sheets

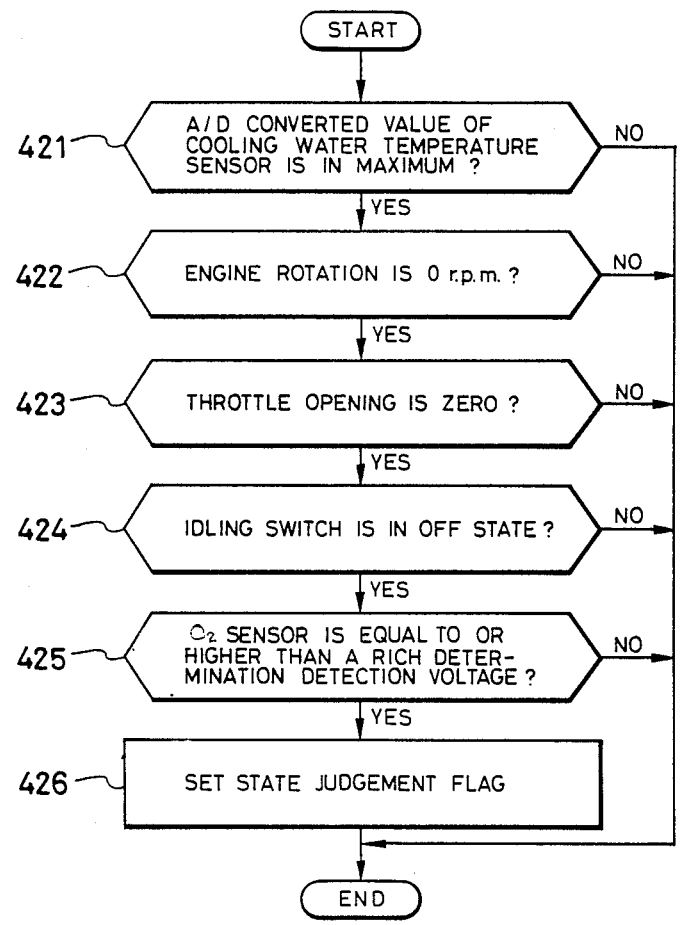

VEHICLE CONTROL APPARATUS

This is a continuation of co-pending application Serial No. 795,938 filed on Oct. 17, 1985, now abandoned.

BACKGROUND OF THE INVENTION

The present invention generally relates to a vehicle control apparatus and particularly related to a vehicle control apparatus in which when the control apparatus is tested, the setting contents of a specification change-over means in the control apparatus can be checked from outside of the control apparatus regardless of control logic.

Recently, a variety of vehicle control apparatuses using microcomputers have become popular to use. As an example of such a vehicle control apparatus, an engine air-fuel ratio control apparatus comprising operational blocks corresponding to a CPU (central processing unit), an RAM (random access memory), an ROM (read only memory), an A/D (analogue-to-digital) converter, an I/O (input/output) unit, etc. is disclosed in "Automobile Technology" Vol. 38, No. 2, 1984, page 158.

A variety of control specifications are required for such engine control apparatuses in accordance with the kind of vehicle, (with which it is assiciated)the kind of engine capacity, the kind of transmission, and so on, and a demand for various kinds of engine control apparatuses which can satisfy various requirements has become stronger and stronger.

In order to respond to such a demand, it is possible to consider an engine control apparatus arranged such that a variety of demand control specifications, in other words, various control data and control logic, are stored in advance in an ROM provided in the engine control apparatus and one of many possible demand control specifications is selected on a basis of selection data applied to an input port of a microcomputer or the like in the engine control apparatus.

When the thus arranged control apparatus is tested individually or as a unit, it is necessary to test whether the control apparatus can function correctly or not from outside thereof, through terminals of the control apparatus.

For example, in some cases, a test can be made only through a connector to which an outside connector can be connected from outside of the apparatus, after a control circuit printed on a substrate has been received in a housing and the parts number for identification has been indicated on the housing.

In such cases, in order to judge which one of the control specifications stored in the ROM in the control apparatus is selected, it is necessary to make the judgement on the bases of an externally inspected difference in operation as a difference in control specification. In order to identify the kind of a control apparatus among a variety of control apparatuses in which the respective specifications are varied from one another in control data, however, there have often been difficulties in a correct execution of the test. For, example, typically the method of test has been complicated, thus, resulting in a long time has been taken for the test, etc.

In those cases, however, there is a case where ROMs which have been subject to unit test in advance are used in the control apparatuses and the operation of various input/output terminals of the control apparatuses can be tested in a short time regardless of the partial variations in control specifications, and therefore a difficulty is only in distinguishing the partial variations in control specifications.

For example, in a case where the control data is different between two kinds of controls apparatuses only in the points that two kinds of the control apparatuses have time data of 10 minutes and 20 minutes respectively, there has been a problem that it is impossible to distinguish the kind of a control apparatus unless the control apparatus is caused to operate for at least 10 minutes and therefore it takes a very long time for execution of the test. The difficulty has been a serious problem in mass-production of control apparatuses.

SUMMARY OF THE INVENTION

It is therefore an object of the present invention to solve the above-mentioned problems in the prior art.

It is another object of the present invention to provide a control apparatus for a vehicle in which, when the control apparatus is tested, the setting contents of a specification change-over means provided in the control apparatus can be checked in a short time from outside of the control apparatus regardless of control logic.

In order to attain the above objects according to the present invention, the vehicle control apparatus comprises a condition detection means for detecting an output condition of whether any of possible sensors is in a condition which is improbable in practical use, and a controlled variable conversion means for converting information of the specification change-over means for selection control procedures or control data into a controlled variable for an object to be controlled.

In the vehicle control apparatus, when an input information of a condition which is improbable in practical use and which is a predetermined one detected by the condition detection means, the information of the specification change-over means is output as a controlled variable for the object to be controlled, and the information of the specification change-over means is judged from outside of the control apparatus to inspect the kind of the specification.

BRIEF DESCRIPTION OF THE DRAWINGS

Above and other objects, features and advantages of the present invention will appear more fully from the following description in conjunction with the accompanying drawings, in which;

FIGS. 3 and 4 are flowcharts for explaining the operation of the embodiment of FIG. 2.

DETAILED DESCRIPTION OF THE PREFERRED EMBODIMENT

Figure 1:
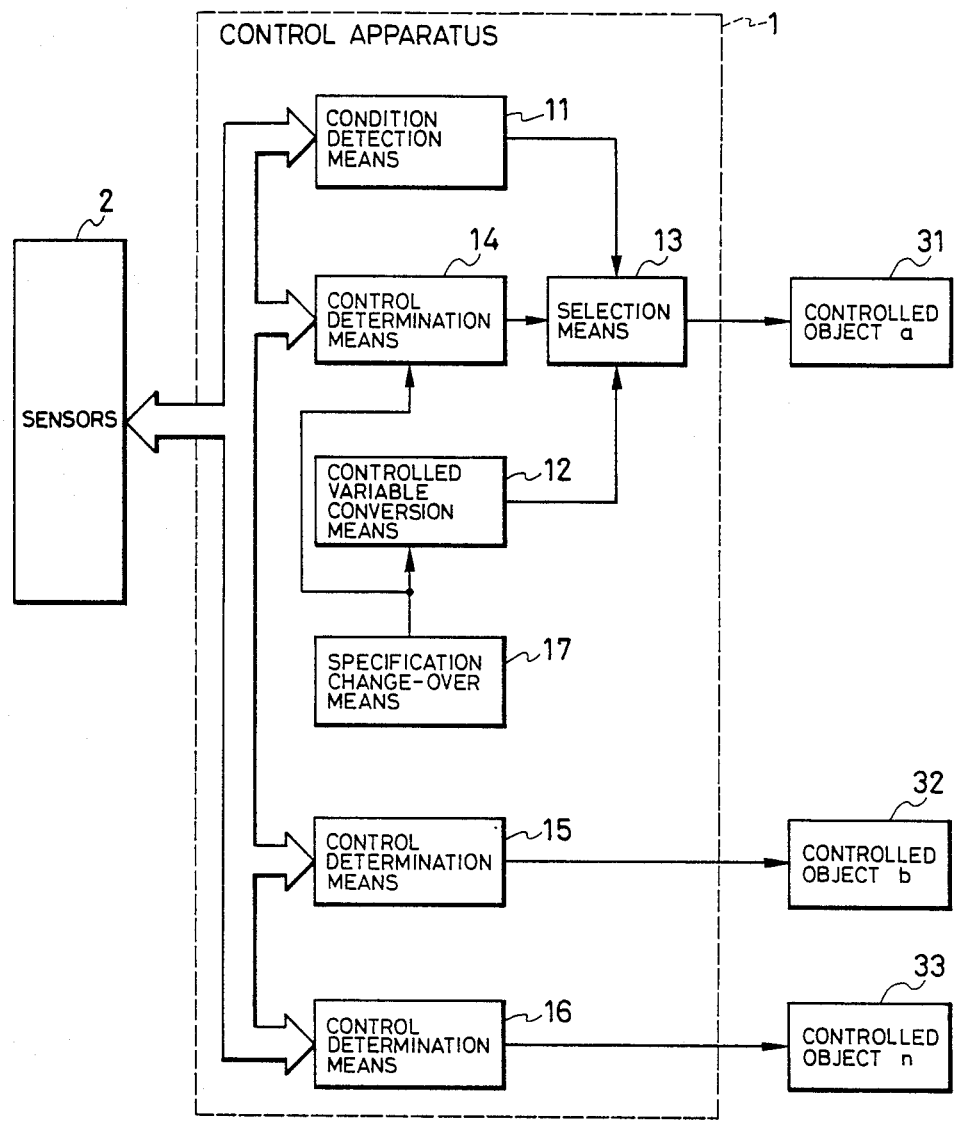
FIG. 1 is a block diagram showing an embodiment of the vehicle control apparatus according to the present invention.

Referring to the drawings, an embodiment of the vehicle control apparatus according to the present invention will be described hereunder in detail. FIG. 1 is a functional block diagram showing the embodiment. In FIG. 1, a control apparatus 1 employing a microcomputer is connected to a plurality of sensors 2 for detecting conditions at various parts of a vehicle, and objects 31 through 33 to be controlled by the control apparatus 1.

In the control apparatus 1, a condition detection means 11 and control determination means 14 through 16 carry out data transfer with the sensors 2. The output of a specification change-over means 17 is applied to a controlled-variable conversion means 12, and a control determination means 14. The output of the condition detection means 11 is applied to the selection means 13, and the controlled object 31 is controlled by the output of the selection means 13.

The outputs of the control determination means 15 and 16 are transferred to the controlled objects 32 and 33, respectively. That is, the control determination means 15 and 16 are arranged to process and determine the contents of control for the controlled objects 32 and 33 on the bases of output signals of the sensors 2 in accordance with a predetermined procedure.

The condition detection means 11 is arranged to detect a fact that any of the sensors 2 produces an output signal which has been predetermined to represent a condition improbable in a practical case. The specification change-over means 17 is arranged to designate one of the plurality of control procedures or control data stored in advance.

The controlled-variable conversion means 12 is arranged to convert information applied from the specification change-over means 17 into a controlled variable for the controlled object 31, and the control determination means 14 is arranged to determine the controlled variable that is required for the controlled object 31 in practical use.

The selection means 13 is arranged to be responsive to the output signal of the condition detection means 11 to output a selected one of the respective outputs of the control determination means 14 and the controlled-variable conversion means 12 as a controlled variable for the controlled object 31.

In FIG. 1, when the condition detection means 11 detects a fact that an output signal from any of the sensors 2 is in a condition which has been predetermined as being improbable in a practical use, the data of the controlled-variable conversion means 12 is output as a controlled variable for the controlled object 31 through the selection means 13.

Accordingly, when the control apparatus 1 is subject to a unit test, a predetermined signal improbable in practical use is applied, instead of an output of each sensor 2, to each input terminal of the control apparatus 1, and the controlled variable for the controlled object 31 is measured, so that the condition of the specification change-over means 17 can be distinguished easily in a short time regardless of any possible difference in a control specification.

Figure 2:
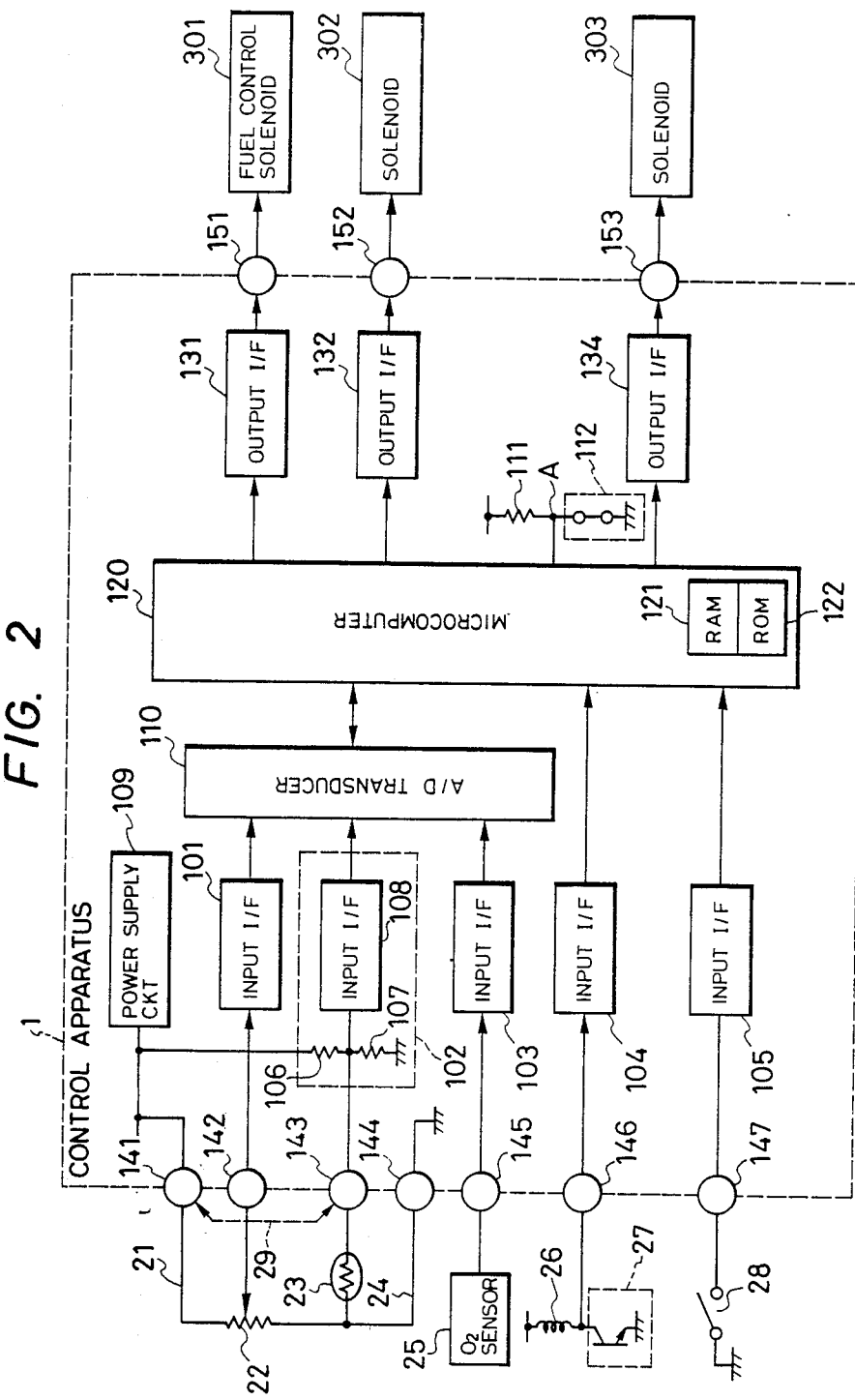
FIG. 2 is a block diagram showing a specific construction of the vehicle control apparatus of FIG. 1.

FIG. 2 is a block diagram showing a specific embodiment of the present invention. The drawing shows a whole arrangement of an air-fuel ratio control system. A control apparatus 1 has terminals 141 through 147, and 151 through 153. A power supply line 21 for energizing sensors is connected to the terminal 141, a movable arm of a potentiometer constituting a throttle opening sensor 22 for converting a throttle opening into a voltage signal is connected to the terminal 142, one end of the potentiometer being connected to the power supply line 21, a cooling water temperature sensor 23 constituted by a thermistor for detecting a temperature of cooling water is connected between the other end of the throttle opening sensor 22 and a terminal 143, and an earth line 24 for the sensors is connected between the terminal 144 and the junction point beween the throttle opening sensor 22 and the cooling water temperature sensor 23.

The terminals 141 is connected to a power supply circuit 109, the terminals 142 and 143 are connected to respective input terminals of input interfaces (hereinafter referred to as input I/Fs") 101 and 108, and the terminal 144 is earthed.

The power supply circuit 109 is connected to the earth through resistors 106 and 107. The power supply circuit 109 is provided for supplying electric power to the throtte opening sensor 22 and parts in the control apparatus 1. The junction point between the resistors 106 and 107 is connected to an input terminal of the input I/F 108. The input I/F 108 and the resistors 106 and 107 constitute an input I/F 102.

The resistors 106 and 107 form a resistor network together with the cooling water temperature sensor 23 so as to convert the temperature of cooling water into a voltage signal.

An $O_2$ sensor 25 for detecting a density of oxygen in an exhaust gas is connected to the input terminal of an input I/F 103 through the terminal 145, the junction point between an ignition coil 26 and an igniter 27 for controlling the ignition coil 26 is connected to the input terminal of an input I/F 104 through the terminal 146, and an idle switch 28 for detecting whether the throttle is in the depressed condition or not is connected to the input terminal of an input I/F 105 through the terminal 147.

Each of the input I/Fs 101, 103 through 105, and 108 is constituted by a filter circuit or the like for eliminating noise components. The respective outputs of the input I/Fs 101, 108, and 103 are applied to an A/D converter 110, and the respective outputs of the input I/Fs 104 and 105 are applied to a microcomputer 120. Data transfer is carried out between the A/D converter 110 and the microcomputer 120.

The microcomputer 120 is provided with an RAM 121 and an ROM 122 therein, and is connected to a junction point A between a resistor 111 and a specification change-over line 112. The resistor 111 and the specification change-over line 112 are connected in series between the power supply and earth.

The output of the microcomputer 120 is applied to a fuel control solenoid 301 through an output interface circuit (hereinafter referred to as output I/F) 131 and the terminal 151, to a solenoid 302 through an output I/F 132 and the terminal 152, and to a solenoid 303 through an output I/F 134 and the terminal 153.

The output I/Fs 131, 132 and 134 are arranged to amplify the output signals of the microcomputer 120.

The fuel control solenoid 301 is incorporated in a carburetar of the engine, and is subject to duty-factor control so as to the air-fuel ratio in accordance with the controlled valve or the duty factor. The solenoid 302 and 303 are provided to control an exhaust gas.

Next, the operation of the control apparatus 1 shown in FIG. 2 is described. The A/D converter 110 receives the respective outputs of the throttle opening sensor 22, the cooling water temperature sensor 23, and the $O_2$ sensor 25 through the respective input I/Fs 101, 108 and 103 so as to convert them into digital signals respectively. The microcomputer 120 receives those digital signals from the A/D converter 110 so as to read the input information from the respective sensors.

The microcomputer 120 receives an intermittent signal from the ignition coil 26 through the terminal 146 and the input I/F 104 so as to measure the time of ignition interval. The microcomputer 120 converts the measured time of ignition interval into the rotational speed of the engine so that the thus measured rotational speed is utilized for various control decisions.

The microcomputer 120 receives an signal from the idling switch 28 through the terminal 147 and the input I/F 105 so as to judge where the idling switch 28 is in an OFF state or in an ON state on the basis of the input signal.

On the basis of the above-described input information, the microcomputer 120 determines the control logic for the fuel control solenoid 301, and the solenoids 302 and 303 in accordance with a procedure stored in the ROM 122.

On the other hand, the voltage at the junction point A varies depending on the existence of the specification change-over line 112. Specifically, if the specification change-over lines 112 is closed the voltage at the junction point A is equal to the earth potential or zero volt, while if the specification change-over line 112 is opened the voltage at the junction point A is equal to the power supply voltage. The microcomputer 120 reads the existence of the specification change-over line 112 on the basis of a voltage signal from the junction point A so as to carry out the change-over of the control specification.

Figure 3:
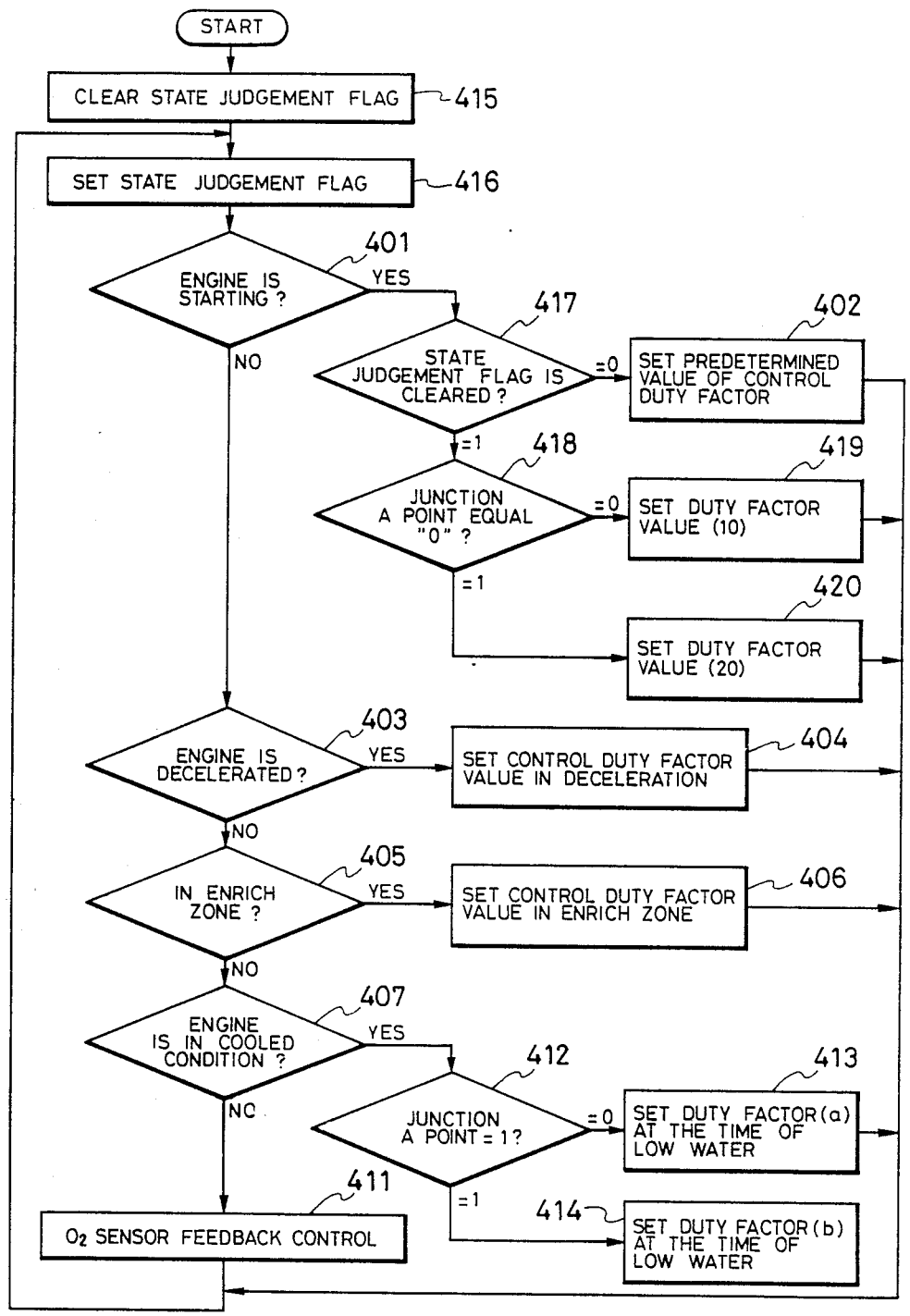

The solenoinds 302 and 303 are arranged so as to be turned off when a rotational speed of the engine exceeds a predetermined valve, and the fuel control solenoid 301 is arranged so as to be controlled in accordance with the flowchart of FIG. 3.

In FIG. 3, in the step 415, a state judgement flag which is used later in the step 417 is cleared upon turning-on of a power supply of the control apparatus 1.

In the step 416, the state judgement flag is set when an output signal of any of the sensors shows the condition improbable in a vehicle in practical use.

The detail of the step 416 is described by using FIG. 4. It is assumed that the terminals 141 and 143 are short-circuited temporarily as indicated by a broken line 29 in FIG. 2 when the control apparatus 1 is subject to a unit test.

The voltage applied to the terminal 143 is normally obtained by dividing the sensor power supply voltage through the resistors 106 and 107, and the cooling water temperature sensor 23. Accordingly, the voltage at the terminal 143 normally exhibits a lower value than the sensor power supply voltage. If the terminals 141 and 143 are short-circuited as described above, the voltage at the terminal 143 becomes equal to the sensor power supply voltage. In this case, the voltage at the terminal 143 is a value improbable in practical use.

In FIG. 4, in the step 421, the A.D converted value of the cooling water temperature sensor 23 is determined by the voltage division through the resistors 106 and 107 when terminals 141 and 143 are not short-circuited, and this value does not become maximum even when the connection to the cooling water temperature sensor is opened. Although the operation is shifted to the step only when the A/D converted value of the cooling water temperature sensor 23 becomes maximum, that is, becomes equal to the sensor power supply voltage, the operation does not pass through the state judgement flag set processing in the step 426 unless the A/D converted value of the cooling water temperature censor 23 becomes maximum.

Similarly to this, thereafter, only when a combination of the sensors improbable in practical use is established in each of the following steps, the state judgement flag is set in the step 426 so as to prevent a misjudgement from occurring.

Specifically, the state judgement flag is set in the step 426 only when all the conditions in the steps 422 through 425 are satisfied, that is, only when the engine rotational speed is 0 r.p.m. in a step 422, the throttle is fully opened, that is, the A/D converted value of the throttle opening is zero in a step 423, the accelerator is in the depressed state, that is, the idling switch is in the OFF-state in the step 424, and a output signal of the $O_2$ sensor 25 is equal to or higher than a rich determination detection voltage in a step 425.

When the control apparatus 1 is subject to a unit test, it is possible to apply a signal to each of the terminals 141 through 147 independently of each other, and therefore it is easy to apply input information improbable in practical use to the terminals so as to make all the conditions shown in FIG. 4 become established Referring to FIG. 3, the normal operation of the air-fuel ratio control will be described. In this case, not all the conditions in the steps 421 through 425 shown in the flowchart of FIG. 4 are established simultaneously, so that the state judgement flag is never set in the step 426.

In the step 401, it is determined that the engine is in the state of cranking (starting) when the rotational speed of the engine is not higher than 400 r.p.m. and the state judgement flag has been kept in the cleared state since it was cleared in starting in the step 415. A predetermined value of a control duty factor at the time of starting is output as a controlled variable in starting, in a step 402.

The microcomputer 120 converts the duty factor value that is a controlled variable at the time of starting into a pulse signal through well known timer interruption processing, so as to control the duty factor of the fuel control solenoid 301.

Similarly, every time the control duty factor value for the control solenoid 301 is set, the control duty factor value is converted into a pulse signal through timer interruption processing. The process of the conversion of the duty factor value into a pulse signal is well-known in the art and is omitted herein.

When a rotational speed the engine exceeds 400 r.p.m. in the step 401, the operation is shifted to a step 403. In the step 403, judgement is made as to whether the engine is being decelerated or not on the basis of the engine rotational speed and the information of the idling switch 28. If the judgement proves that the engine is in the decelerating state in a step 403, a control duty factor value in deceleration is set as a controlled variable in deceleration in the step 404.

In the step 405, judgement is made as to whether the control is in the enrich zone or not on the basis of the engine rotational speed and the information of the throttle opening sensor 22. If the judgement proves that the control is in the enrich zone in the step 405, a control duty factor value in the enrich zone is set as a controlled variable in the enrich zone in a step 406.

In the step 407, judgement is made as to whether the engine is in the cooled condition or not, that is, whether the temperature of the cooling water control is low or not on the basis of the information from the cooling water temperature sensor 23. If the judgement proves that the cooling water temperature is low in the step 407, operation is shifted to a step 412, in which the voltage at the junction point A which is a signal for the change-over of specification is detected. If the judgement proves that the voltage is "0" in the step 412, a controlled variable a in the low water temperature is set in a step 413, while if the judgement proves that the voltage is "1" in the step 412, a controlled variable b in the low water temperature is set in a step 414, so that the specification is partly changed-over depending on the existence of the specification change-over line 112.

If the judgement proves that the engine is in the warming-up state in the step 407, operation is shifted to a step 411 in which the air-fuel ratio feedback control by the $O_2$ sensor 25 is carried out to determine the control duty factor value by a generally known proportional-plus-integral method so as to make the air-fuel ratio be a theoretical air-fuel ratio.

Next, the case where the control apparatus 1 is subject to unit test will be described. In the, input information is applied to the control apparatus 1 so that all the conditions in the steps 421 through 425 in FIG. 4 are tempararily established as described above, so that the state judgement flag is set. At that time, the engine speed is not higher than 400 r.p.m., and the operation is shifted to a step 417. Since the state judgement flag is in the set state in the step 417, the operation is shifted to a step 418.

When the level at the junction point A is "0" in the step 418, a control duty factor of 10(%) is set in the step 419 as a controlled variable for the fuel control solenoid 301.

If the level at the junction point A is "1", on the contrary, a control duty factor of 20(%) is set in the step 420 as a controlled variable for the fuel control solenoid 301.

Thus, in test, the specification designated by the specification change-over line 112 can be read from outside the control apparatus by measuring the duty factor value upon application of input information which is improbable in practical use.

Although the above embodiments show the case where the controlled object is subject to duty factor control, the controlled variable may be output as a time width, or the like.

According to the present invention, as described above, the control apparatus is arranged in a manner so that, when conditions which have been predetermined as being improbable in practical used are detected as input information from the sensors, the contents of the specification change-over means provided in the control apparatus are output in the form of a duty factor value, a time width, or the like, which is applied to the controlled object. Accordingly, in a unit test of the control apparatus, the contents set in the specification change-over means can be tested in a short time from outside the control apparatus regardless of the control logic.

What is claimed is:

1. An apparatus for controlling a vehicle comprising:
a plurality of sensor means for detecting conditions at various parts of said vehicle;
at least one controlled object to be controlled; and
control means for appropriately controlling said controlled object according to an output of said plurality of sensor means, said control means comprising:
detection means for detecting an output information of at least one sensor of said plurality of sensors, said detecting means outputting a signal when said output information of said at least one sensor is of a predetermined condition which is improbable in practical use;
first controlled variable determining means for determining a first controlled variable for said controlled object according to said output of said plurality of sensor means;
specification change-over means for applying data information for selecting pre-stored one of control procedures and control data to said first controlled variable determining means;
second controlled variable determining means for converting said data information applied from said specification change-over means into a second controlled variable for said controlled object; and
selecting means for selecting one of said first and second variables as an actual controlled value of said controlled object according to said output signal of said detecting means.

* * * * *